(12) United States Patent
Wong et al.

(10) Patent No.: US 7,547,925 B2
(45) Date of Patent: Jun. 16, 2009

(54) SUPERLATTICE STRAIN RELIEF LAYER FOR SEMICONDUCTOR DEVICES

(75) Inventors: William S. Wong, San Carlos, CA (US);
Michael A. Kneissl, Berlin (DE);
Zhihong Yang, Sunnyvale, CA (US);
Mark Teepe, Menlo Park, CA (US);
Cliff Knollenberg, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 322 days.

(21) Appl. No.: 11/356,769

(22) Filed: Feb. 17, 2006

(65) Prior Publication Data
US 2007/0108456 A1 May 17, 2007

Related U.S. Application Data

(60) Provisional application No. 60/736,362, filed on Nov. 14, 2005, provisional application No. 60/736,531, filed on Nov. 14, 2005.

(51) Int. Cl.
*H01L 27/15* (2006.01)
(52) U.S. Cl. .................. 257/103; 257/79; 257/E33.032
(58) Field of Classification Search ............... 257/79, 257/103, E33.031, E33.032
See application file for complete search history.

(56) References Cited

U.S. PATENT DOCUMENTS

| | | | |
|---|---|---|---|
| 5,578,839 A | 11/1996 | Nakamura et al. | |
| 6,078,064 A | 6/2000 | Ming-Jiunn et al. | |
| 6,107,644 A | 8/2000 | Shakuda et al. | |
| 6,365,429 B1 | 4/2002 | Kneissl et al. | |
| 6,455,340 B1 | 9/2002 | Chua et al. | |
| 6,456,640 B1 | 9/2002 | Okumura | |
| 6,617,261 B2 | 9/2003 | Wong et al. | |
| 6,744,800 B1 | 6/2004 | Kneissl et al. | |
| 6,757,314 B2 | 6/2004 | Kneissl et al. | |
| 6,864,502 B2 | 3/2005 | Shibata et al. | |
| 6,865,202 B2 | 3/2005 | Matsumoto | |
| 6,875,627 B2 | 4/2005 | Bour et al. | |
| 6,875,629 B2 | 4/2005 | Senda et al. | |
| 6,881,601 B2 | 4/2005 | Sugawara | |
| 6,898,226 B2 | 5/2005 | Otoma et al. | |
| 6,949,140 B2 | 9/2005 | Sarayama et al. | |

(Continued)

FOREIGN PATENT DOCUMENTS

WO        WO 02/097904        12/2002

OTHER PUBLICATIONS

Darakchieva et al. "Strain evolution and phonons in AlN/GaN superlattices," Mat. Res Soc. Symp. Proc. vol. 798 2004 Research Society, published winter 2003.*

(Continued)

*Primary Examiner*—Jack Chen
*Assistant Examiner*—Matthew Reames
(74) *Attorney, Agent, or Firm*—Jonathan A. Small

(57) ABSTRACT

A GaN/AlN superlattice is formed over a GaN/sapphire template structure, serving in part as a strain relief layer for growth of subsequent layers (e.g., deep UV light emitting diodes). The GaN/AlN superlattice mitigates the strain between a GaN/sapphire template and a multiple quantum well heterostructure active region, allowing the use of high Al mole fraction in the active region, and therefore emission in the deep UV wavelengths.

6 Claims, 7 Drawing Sheets

U.S. PATENT DOCUMENTS

2002/0195606 A1    12/2002    Edmond
2006/0118820 A1*    6/2006    Gaska et al. ................ 257/189

OTHER PUBLICATIONS

Vaudo et al., *GaN Boule Growth: A Pathway To GaN Wafers With Improved Material Quality*, Physica Status Solidi A, v 194, n 2, Dec. 2002, p. 494-7, ISSN: 0031-8965, CODEN: PSSABA.

Nakamura et al., "InGaN/GaN/AlGaN-Based Laser Diodes with Modulation-Doped Strained-Layer Superlattices", Japanese Journal of Applied Physics, vol. 36, No. 12A, pp. L1568-L1571 (Japan 1997).
Sitar, "Growth of AlN/GaN Layered Structues by Gas Source Molecular-Beam Epitaxy", J. Appl. Vac. Sci. & Tech., vol. 8, No. 2, pp. 316-322 (1990).
Chen, "AlGaN Layers Grown on GaN Using Strained-Relief Interlayers", Appl. Phys. Let., vol. 81, No. 26, pp. 4961-4963 (2002).
European Search Report for European equivalent of present application dated Mar. 22, 2007.

* cited by examiner

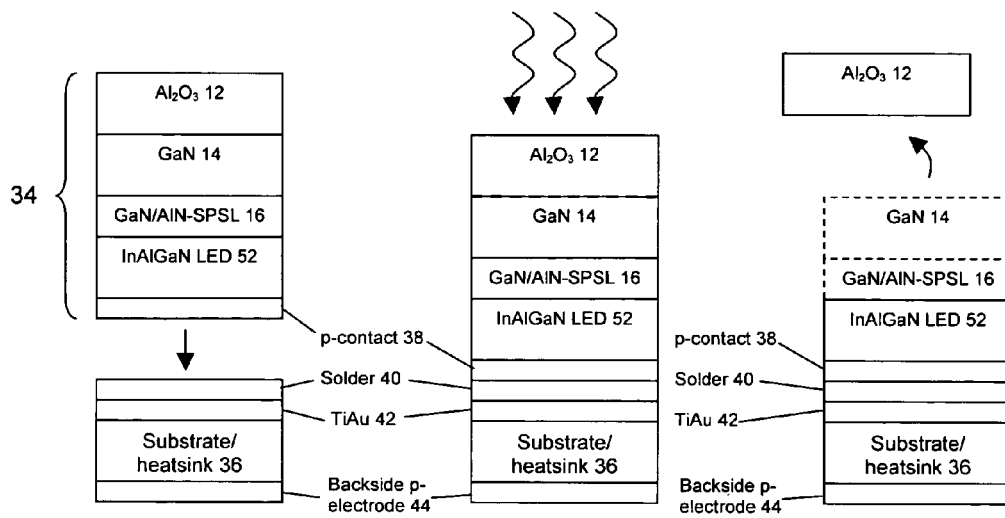
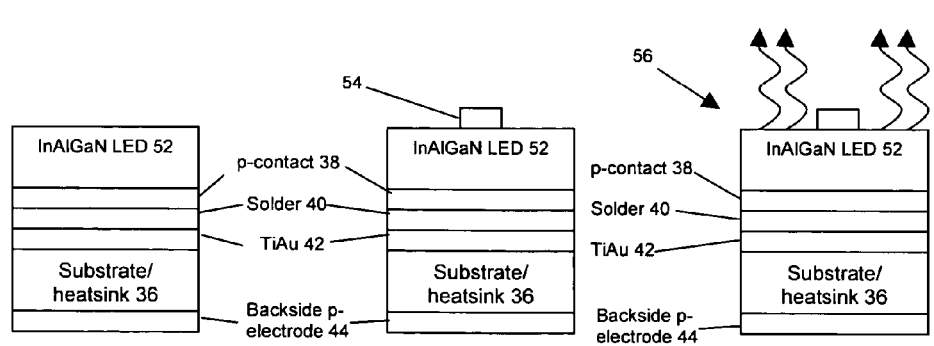
FIG. 2A  FIG. 2B  FIG. 2C
FIG. 2D  FIG. 2E  FIG. 2F

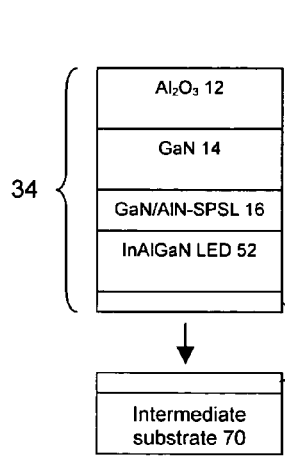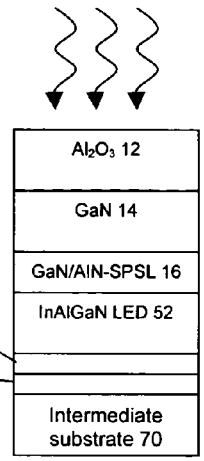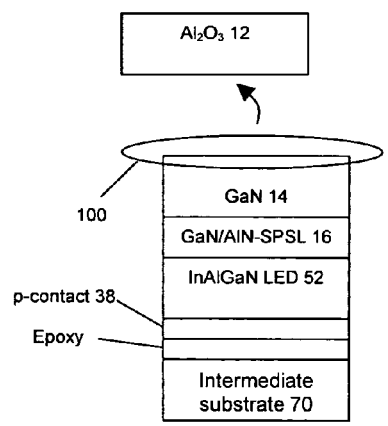
FIG. 8A  FIG. 8B  FIG. 8C
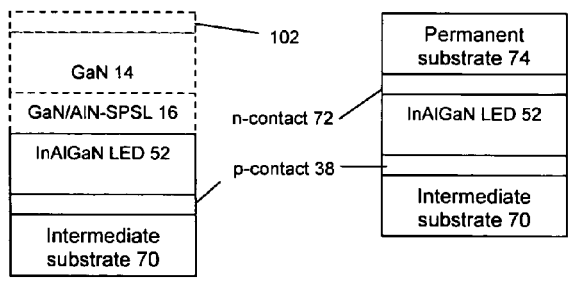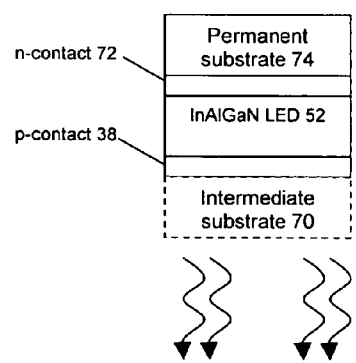
FIG. 8D  FIG. 8E  FIG. 8F

SUPERLATTICE STRAIN RELIEF LAYER FOR SEMICONDUCTOR DEVICES

CROSS-REFERENCE TO RELATED APPLICATIONS

The present invention is related to provisional U.S. Applications for Letters Patent titled "Superlattice Strain Relief Layer For Semiconductor Devices", U.S. Ser. No. 60/736,362, and "Method For Controlling The Structure And Surface Qualities Of A Thin Film And Product Produced Thereby", U.S. Ser. No. 60/736,531, each filed on Nov. 14, 2005, each assigned to the same assignee as the present application, to which priority is hereby claimed, and each being incorporated by reference herein.

STATEMENT REGARDING FEDERALLY SPONSORED RESEARCH AND DEVELOPMENT

The U.S. Government has a fully paid-up license in this invention and the right in limited circumstances to require the patent owner(s) to license others on reasonable terms as provided for by the terms of contract number N66001-02-C-8017 awarded by the Defense Advanced Research Projects Agency, and contract number DAAH01-03-9-R003 sponsored by the U.S. Army Aviation and Missile Command.

BACKGROUND OF THE INVENTION

1. Field of the Invention

The present invention is related generally to the field of light emitting diode devices, and more specifically to an architecture for an improved high-Al content, low defect heterostructure quantum well surface emitting light emitting diode device.

2. Description of the Prior Art

In the III-V compound semiconductor family, the nitrides have been used to fabricate visible wavelength light emitting diode active regions. They also exhibit a sufficiently high bandgap to produce devices capable of emitting light in the ultraviolet, for example wavelengths between 300 and 400 nanometers. In particular, InAlGaN systems have been developed and implemented in visible and UV spectrum light emitting diodes (LEDs), such as disclosed in. U.S. Pat. No. 6,875,627 to Bour et al., which is incorporated herein by reference. These devices are typically formed on an $Al_2O_3$ (sapphire) substrate, and comprise thereover a GaN:Si or AlGaN template layer, an AlGaN:Si/GaN superlattice structure for reducing optical leakage, an n-type electrode contact layer, a GaN n-type waveguide, an InGaN quantum well heterostructure active region, and a GaN p-type waveguide region. In addition, the complete device may also have deposited thereover a p-type AlGaN:Mg cladding layer and a capping layer below a p-type electrode.

While significant improvements have been made in device reliability, optical power output, and mode stability, the performance of the nitride-based light emitting diode emitting in the ultraviolet (UV) is still far inferior to that of blue or green light emitting diode. It is particularly true that for the UV light emitting diodes, the nature of the substrate and template layer have a critical impact on the overall device performance. For example, electrical resistance between the structural layers of the device significantly effects optical output. While $Al_2O_3$ (sapphire) as a substrate has numerous advantages, the AlGaN template layer formed over the typical $Al_2O_3$ substrate posses high series resistance due to limited doping capabilities. Furthermore, the crystallographic structure of the device layers plays a key role in the device's operational characteristics, and the AlGaN template layer provides a relatively poor crystalline template.

The dislocation densities in AlGaN or AlN template layers on sapphire are typically in the mid $10_9$ to high $10_{10}$ cm$^{-2}$ range. As a consequence, the external quantum efficiencies of deep UV light emitting diodes in the 250 nm to 350 nm range are still below 2% even for the very best devices (external quantum efficiencies near 50% have been demonstrated for blue GaN-based LED structures). The high dislocation densities in AlGaN or AlN template layers on sapphire also pose significant problems for the light emitting diode device lifetimes.

GaN epitaxial layers on sapphire substrates have proven to be a better template for InGaAlN film growth, providing excellent optoelectronic quality for visible light emitting diode devices and reasonable dislocation densities. The dislocation densities in GaN template layers on sapphire are typically in the low $10_9$ to mid $10^7$ cm$^{-2}$ ranges. Accordingly, sapphire with a GaN template layer is the preferred foundation for visible GaN-based light emitting diodes.

The output wavelength of the light emitting diode is inversely related to the Al content in the multiple quantum well heterostructure (MQWH) active region of the device. Thus, in order to obtain shorter wavelength devices, such as those emitting in the UV, the Al content of the HQWH region must be increased over that found in devices emitting in the visible spectrum. However, increasing the Al content presents a number of structural and device performance problems.

Furthermore, efforts to improve the quality of the LED structure in the ultraviolet range on GaN/sapphire template have presented significant challenges due to the large lattice mismatch between the epitaxial layers formed over the GaN crystallographic template which is known to lead to strain-induced cracking. This lattice mismatch is exacerbated when the Al content of layers formed above the GaN/sapphire system increases. Yet, as previously mentioned, an increased Al content (e.g., up to ~50% in the MQWH active region of a 280 nm light emitting diode, and 60% to 70% in the surrounding AlGaN current and optical confinement layers) is required to obtain devices which emit in the UV. A UV InAlGaN heterostructure grown on GaN/sapphire is under tensile stress, which causes cracking of the AlGaN epitaxial layers when the critical layer thickness is exceeded. The critical thickness for an AlGaN film with a 50% aluminum mole fraction is about 20-50 nm, which is much too thin for realizing a usable device structure in the deep UV. Efforts to provide strain relief to accommodate the lattice mismatch have heretofore proven unsuccessful or impractical.

Various groups have published approaches to dealing with these shortcomings. For example, Han et al., Appl. Phys. Lett, Vol 78, 67 (2001), discuss the use of a single AlN interlayer formed at low temperatures to avoid strain development. This low-temperature AlN interlayer approach has proven unsuccessful in the case of heterostructure growth with high Al mole fractions. Nakamura et al., J. J. Appl. Phys., vol. 36, 1568 (1997) has suggested short period GaN/AlGaN superlattice layers as a way of extending the critical layer thickness of AlGaN films grown pseudomorphically on GaN/sapphire. But the average Al mole fraction in these AlGaN/GaN systems is at such a low level (~10% or less) that it is not compatible with deep UV light emitting diodes. Finally, Chen et al., Appl. Phys. Lett., vol. 81, 4961 (2002) suggests an AlGaN/AlN layer as a dislocation filter for an AlGaN film on a AlGaN/sapphire template. But again, the AlGaN/sapphire template presents the aforementioned series resistance problem. There is a need for a deep UV light emitting diode apparatus with improved operation characteristics, and therefore, there is a need for a method and structure facilitating a high Al content MQWH active region which is free from cracking and related damage.

SUMMARY OF THE INVENTION

Accordingly, the present invention is directed to a GaN/AlN strain relief layer that enables the growth of crack-free thick AlGaN films with high aluminum content on a GaN/sapphire template. According to one aspect of the present invention, an ultraviolet InAlGaN light emitting diode heterostructure is grown on a GaN/sapphire template with a GaN/AlN short period superlattice (SPSL) strain relief layer. The short period superlattice strain relief layer enables the growth of a high-quality and crack-free high aluminum content InAlGaN MQWH active region, providing a light emitting diode capable of emitting in the deep UV wavelength range. The GaN/AlN short period superlattice strain relief layer may be formed in conditions (e.g., temperature and pressure) consistent with the growth of other layers of the device for efficient production.

Optionally, after growth, the deep UV light emitting diode may be flip-chip bonded onto a heatsink and the sapphire substrate removed by excimer laser lift-off. The absorbing GaN template layer and some or all of the GaN/AlN short period superlattice strain relief layer may also be removed, for example by dry-etching (e.g. by CAlBE). Removal of the GaN/sapphire template allows for improved light extraction through the UV-transparent AlGaN current spreading layer and results also in lower operating voltages due to the vertical device structure.

According to another embodiment of the present invention, a GaN/AlN strain relief layer enables the growth of low defect, relatively high Al-content films over a GaN/sapphire template useful for non-optical applications, such as the high electron mobility transistors (HEMTs) and the like.

BRIEF DESCRIPTION OF THE DRAWINGS

These and other aspects, features, and advantages of the present invention will become apparent from the following detailed description and the appended drawings in which like reference numerals denote like elements between the various drawings, but which are not drawn to scale.

FIGS. 2A-2F are illustrations of the steps involved in a laser lift-off (LLO) and etch process to produce a surface-emitting light emitting diode according to an embodiment of the present invention.

FIGS. 8A-8F illustrate an alternate embodiment of the production of a surface emitting LED according to the present invention.

DETAILED DESCRIPTION OF THE INVENTION

Figure 1:
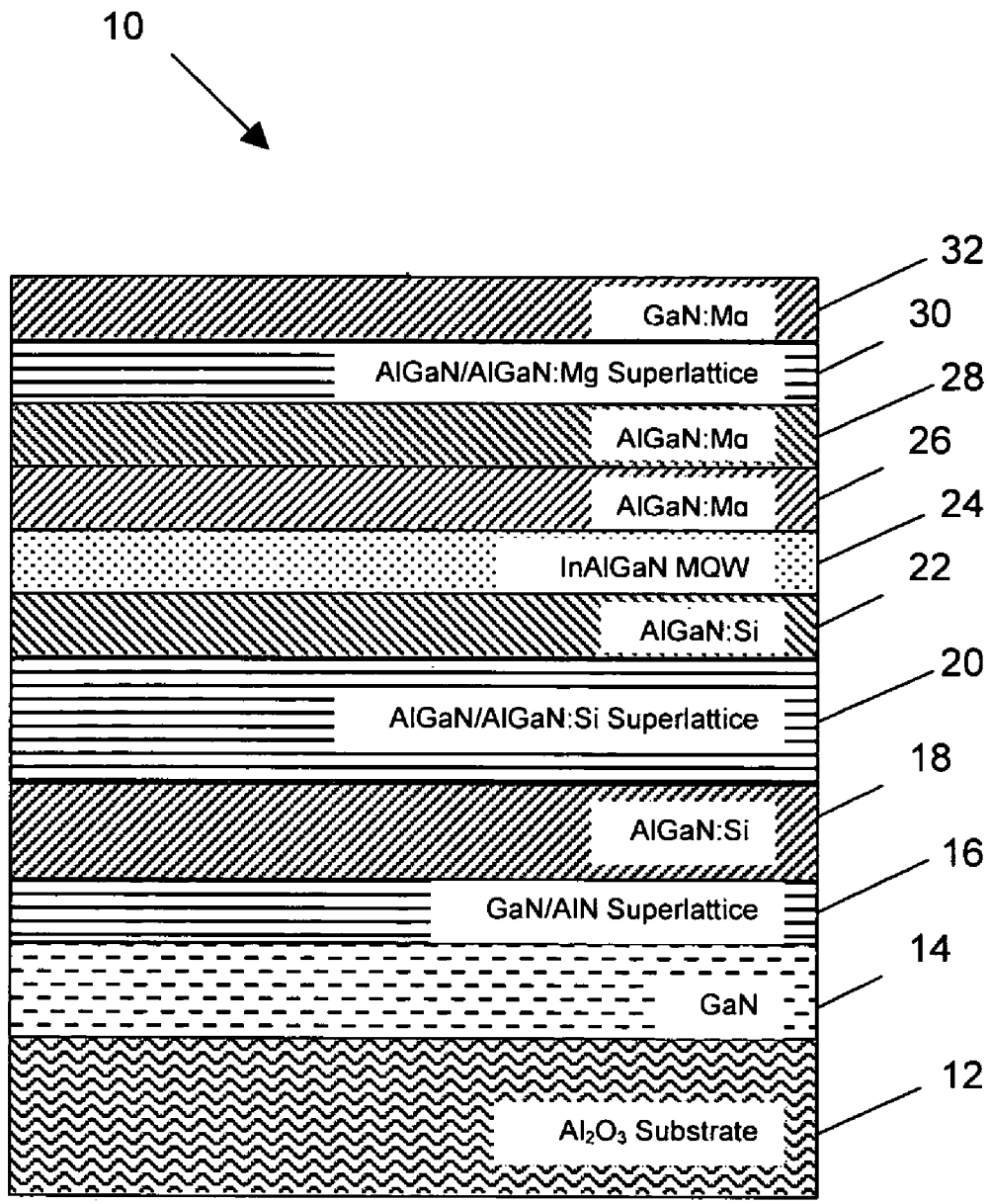
FIG. 1 is a cross-sectional view of a multiple quantum-well heterostructure light emitting diode, including a GaN/AlN superlattice, according to an embodiment of the present invention.

With reference now to FIG. 1, there is shown therein an index guided, buried heterostructure AlGaInN light emitting diode structure in accordance with the present invention. Diode structure comprises an $Al_2O_3$ (sapphire) substrate 12 on which is formed a 2-10 micron thick epitaxial GaN template layer 14. GaN template layer 14 can be Si-doped or undoped and is typically grown at approximately 1100 degree C. and a reactor pressure of approximately 200 Torr. Formed thereon is a GaN/AlN superlattice layer 16, described further below. Formed next is AlGaN:Si. buffer layer 18, and formed thereon is AlGaN/AlGaN:Si superlattice n-strain layer 20 which allows for increased cladding thickness and hence reduced optical leakage of subsequent layers. Formed next is AlGaN:Si n-cladding (index guiding) layer 22. InAlGaN multiple quantum well active layer 24 is formed on layer 22. Formed thereon is AlGaN:Mg p-cladding (index guiding) layer 26, then AlGaN:Mg buffer layer 28. AlGaN/AlGaN:Mg p-strain layer 30 is next deposited, then finally a GaN:Mg capping layer is formed over the structure. The aforementioned layers may be formed, for example, as described in the aforementioned incorporated U.S. Pat. No. 6,875,627 to Bour et al. It will be appreciated that a complete device will also include electrodes, not shown, as well as other similar or alternative devices formed in the manner of an array in appropriate embodiments.

The structure produced is a light emitting diode designed, for example, to emit UV light through the substrate. Since the GaN template layer is absorptive at UV wavelengths, optimal device performance may be obtained by removal of substrate 12 and GaN template layer 14. This may preferably be accomplished by the method, referred to herein as a laser lift-off (LLO) process, described in U.S. Pat. No. 6,757,314, which is incorporated by reference herein. One embodiment of an LLO method bonds a combination substrate/heat sink to a surface opposite the $Al_2O_3$ substrate. An excimer laser is typically employed to decouple the $Al_2O_3$ substrate from the GaN layer, allowing removal of the substrate, the GaN layer is then removed by a chemical process (e.g., dry etch). Some or all of GaN/AlN superlattice layer 16 is also removed by the chemical process at this point. A variation on this method first bonds an intermediate wafer to a surface opposite the $Al_2O_3$ substrate. The $Al_2O_3$ substrate and GaN layer are removed, and the device is then bonded to one of a variety of UV transparent substrates at the surface previously occupied by the GaN layer and $Al_2O_3$ substrate. An example of such a process for removing the substrate and GaN template layer is illustrated in FIGS. 2A-2F, which merely schematically illustrate the light emitting diode according to the present invention (i.e., not all layers thereof are shown in these figures.)

With reference first to FIG. 2A, a light emitting diode 34 (or an array of such devices) of a type described above is indirectly secured (e.g., flip-chip, thermally, or acoustically bonded) to a substrate 36 with high thermal conductivity (such as copper, diamond, bulk AlN, or silicon) to serve as a heat sink. Ideally, the first metal contact 38 (p-contact) of the light emitting diode would be bonded to a solder 40/AuTi 42 layer pair on substrate/heatsink 36 (which may or may not be patterned), with the solder reflowing or deforming to form a permanent electrical, thermal, and mechanical contact/bond between the light emitting diode 34 and substrate/heat sink 36. In some cases the substrate/heatsink may be electrically conductive as well as thermally conductive, providing an electrical contact to the first contact 38 (p-contact) of the light emitting diode structure 34. In such cases an additional contact layer 44 may be placed on the backside of the substrate/heatsink 36 to improve electrical contacting.

Reference is now made to FIG. 2B. With the light emitting diode structure 34 affixed to substrate/heatsink 36, an excimer laser is scanned over the $Al_2O_3$ substrate 12. Due to the bandgap between GaN and its surrounding materials, there is high absorption of the light at the interface between the $Al_2O_3$ substrate 12 and the GaN layer 14. This effectively results in decomposition of the GaN material at the sapphire/GaN interface, weakening or breaking the bond between the two layers. A second step to melt the transformed interface (typically at temperatures greater than the melting point of Ga (Tm~30° C.) will further weaken the interface bond. With the bond sufficiently weakened, the $Al_2O_3$ substrate 12 may simply be mechanically removed from the light emitting diode structure 34, as shown in FIG. 2C.

The residual GaN layer 14 (typically several microns thick) and some or all of the GaN/AlN superlattice 16 are then removed using a dry etch (e.g., CAlBE) or possibly wet etching method. The structure is then substantially as shown in FIG. 2D. A second electrical contact 54 (n-contact) is then patterned directly on the exposed InAlGaN light emitting diode structure 52. This may be achieved in a variety of ways including (but not limited to) standard photolithography or a shadow mask processes. The structure is then as shown in FIG. 2E. The final light emitting diode structure 56 permits light extraction through an upper surface, and electrical contact directly to the light emitting diode active region via the contacts 44, 54 placed in direct contact on opposite sides of the active region.

Figure 3:
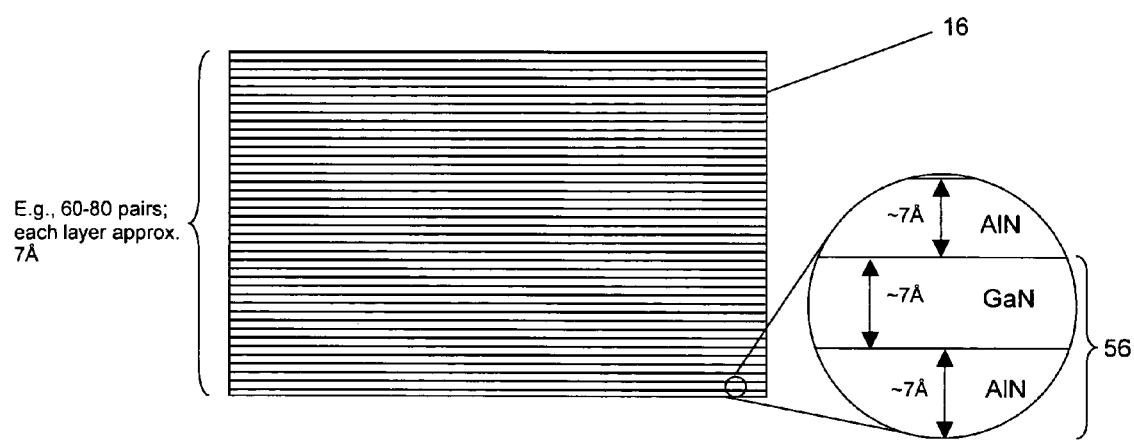
FIG. 3 is a detailed view of a GaN/AlN superlattice structure according to an embodiment of the present invention.

With reference now to FIG. 3, there is shown therein an exemplary embodiment of GaN/AlN superlattice 16, with layers grown in matched pairs 56 with GaN grown on top of AlN (that is, AlN is grown first upon GaN layer 14, then a layer of GaN, then another layer of AlN, and so forth with GaN as the final layer in the superlattice 16, and upon which AlGaN layer 18 is grown). Each of the superlattice pairs consists of an approximately 7 Å wide GaN layer and an approximately 7 Å wide AlN layer. The AlN and GaN layers are grown at approximately 1100 degree C. ° and approximately 200 Torr reactor pressure. The growth rate for the AlN and GaN layer was approximately ~0.5 Å/sec. Superlattice layer 16 is nominally undoped, but could be doped (e.g., Si) by methods known in the art.

It will be appreciated that a critical role of GaN/AlN superlattice 16 is to permit the incorporation of higher amounts of Al in subsequently deposited layers than previously possible, due to the reduced defects in layers deposited over superlattice 16. However, forming each component layer of the superlattice 16 requires setting of processing equipment controls and the introduction of constituent components, thus taking time and consuming processing resources. Therefore, there is a balance to be struck between growing a minimal number of layer pairs to simplify processing and a sufficient number of pairs to allow for a crack-free high Al content heterostructure.

In quantifying this balance, the number of GaN/AlN superlattice pairs was varied between 20 and 80. Upon completion of a UV light emitting diode structure of the type described with regard to FIG. 1, with an Al mole fraction of the AlGaN layers at 25-40%, substrate 12, GaN template layer 14, and superlattice 16 were removed by processes described above and in aforementioned U.S. Pat. No. 6,757,314. The remaining completed devices were examined for structural integrity, and surface condition of AlGaN layer 18. (It is critical that AlGaN layer 18 be crack free so as to provide a suitable foundation for the subsequent layers, and further that the multiple quantum well heterostructure active layer be crack free for device performance.) Furthermore, optical performance of each device was measured. A 20 pair superlattice 16 produced a device which exhibited significant surface irregularity and cracks in the layer 18. Structural cracking decreased in structures with 40 superlatice pairs, but still showed some surface irregularity and cracks. Optimal results (freedom from structural cracks, surface smoothness, light emitting diode performance, minimal member of layer pairs) were obtained for a structure which included a superlattice 16 consisting of 80 GaN/AlN pairs. At 80 superlattice pairs layer 18 showed virtually no detectable damage or cracks. Table 1 summarizes these results. FIGS. 7A-7D are SEM micrographs showing the visible results for this experiment.

TABLE 1

Figure 7A:
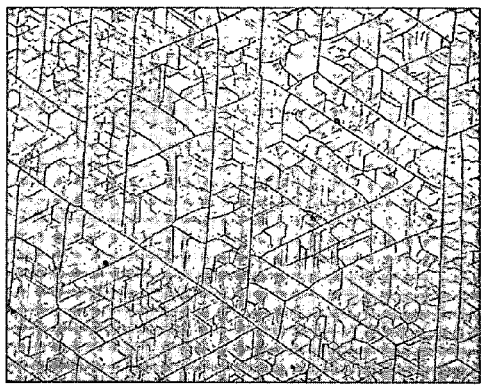
FIGS. 7A-7D are SEM micrographs of a deep UV emitting diode grown on a GaN/sapphire template with the number of layers comprising the superlattice strain relief structure at zero, 20, 40, 60, and 80 layer pairs of GaN/AlN, respectively.
Figure 7B:
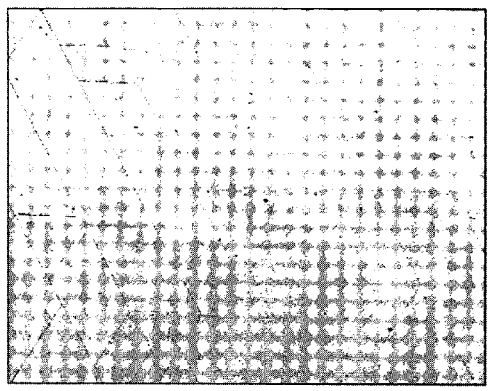
Figure 7C:
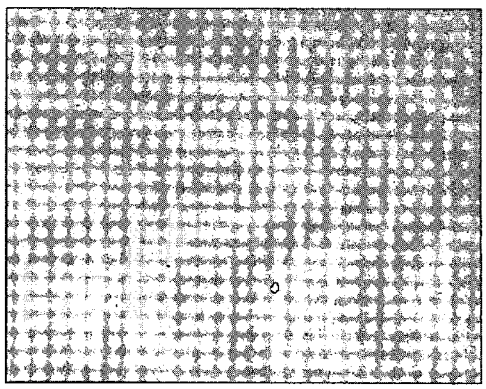
Figure 7D:
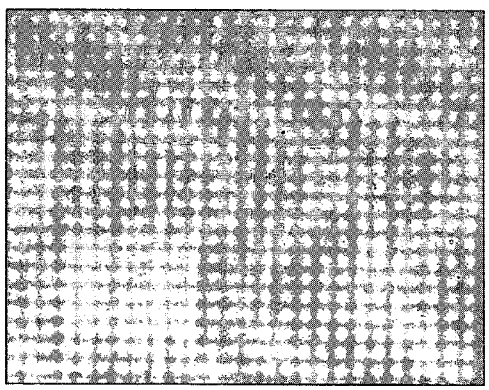

| Number Of AlN/GaN Superlattice Pairs (All 7 Å/ 7 Å) | Surface After Led Growth On GaN/Sapphire | Light Emitting Diode Wavelength | Light Emitting Diode Relative Intensity | SEM Photograph |
|---|---|---|---|---|
| 0 | Extremely heavily cracked | Inoperable | inoperable | FIG. 7A |
| 20 | Heavily cracked | 328.8 nm | 1 | FIG. 7B |
| 40 | A few cracks | 329.8 nm | 1.45 | FIG. 7C |
| 80 | Good, No cracks | 328.3 nm | 3.6 | FIG. 7D |

Appropriate thicknesses of the superlattice layers were also explored by varying each layer thickness between 7 and 14 Å for each of the GaN the AlN layers. The devices were prepared as previously described, and the surface of layer 18 examined. The cracking seemed not to be affected by a change of superlattice layer thickness, although the x-ray diffraction examination (XRD) at full-width half-maximum (FWHM) was the narrowest for the case in which each of the GaN and AlN layers were each 7 Å in thickness. Table 2 summarize these results.

TABLE 2

| AlN/GaN Superlattice Thickness (All 80 Pairs) | (0006) XRD FWHM Of AlGaN Epitaxial Layer On GaN |
|---|---|
| 7/7 Å | 366"-785" |
| 7/14 Å | 418"-680" |
| 14/7 Å | 576" |

Figure 4:
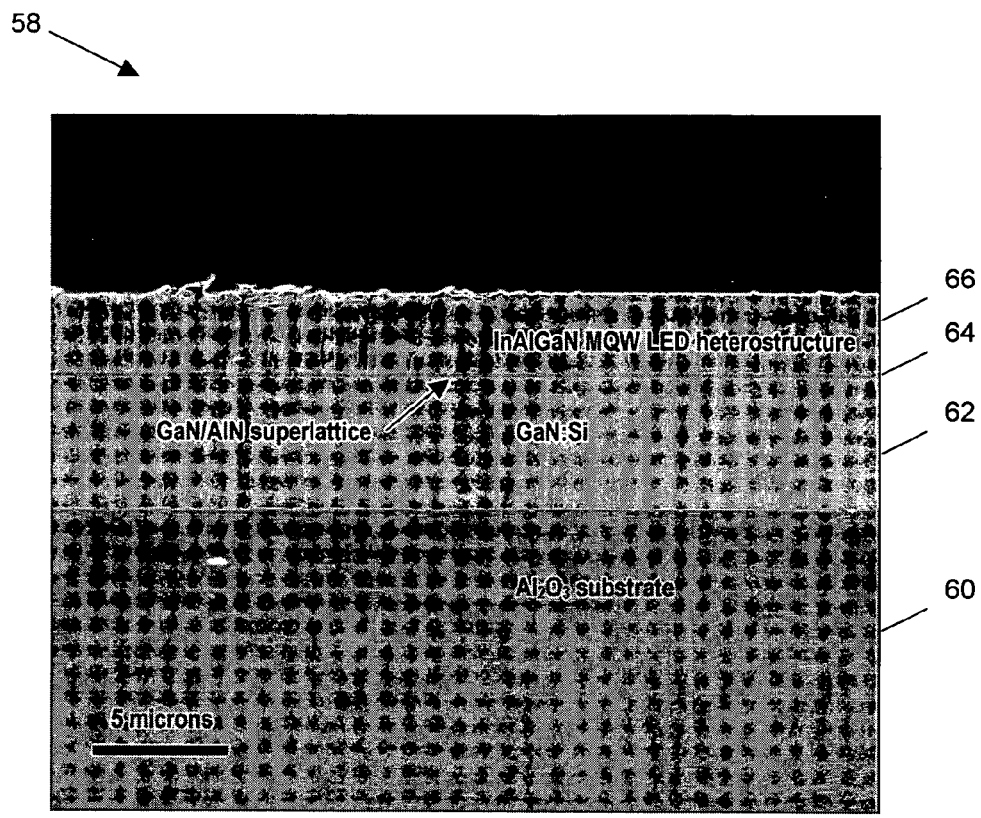
FIG. 4 is a scanning electron microscope (SEM) view of a partial multiple quantum-well heterostructure light emitting diode structure grown on GaN/sapphire template, including a GaN/AlN superlattice, according to an embodiment of the present invention.

FIG. 4 shows a cross-sectional SEM image of a UV light emitting diode heterostructure 58, capable of emission at 325 nm. Layers not specifically shown in FIG. 4 are either too thin to be seen in the SEM image or have low contrast (because of layer doping) as compared with nearby layers. (E.g. The contact layer on top of the structure is only 20 nm and can not be seen in the SEM picture). Structure 58 includes an Al2O3 substrate 60; a GaN:Si template layer 62 formed on and over substrate 60, an 80 layer-pair GaN/AlN superlattice 64 formed on and over GaN:Si layer 62, and an InAlGaN multiple quantum well heterostructure layer 66 formed on and over superlattice 64. Each layer in superlattice 64 is approximately 7 Å thick. The Al content in layer 66 was in the range of 35-40%. As can be seen, in cross section no cracks are visible in layer 66, a feature attributable to the provision of superlattice 64 thereunder.

Figure 5:
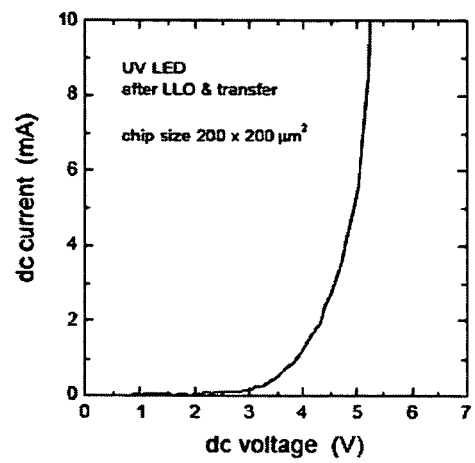
FIG. 5 is a voltage versus current graph, showing acceptable device performance, for a deep UV light emitting diode grown on a GaN/sapphire template with a GaN/AlN superlattice strain relief structure according to the present invention.
Figure 6:
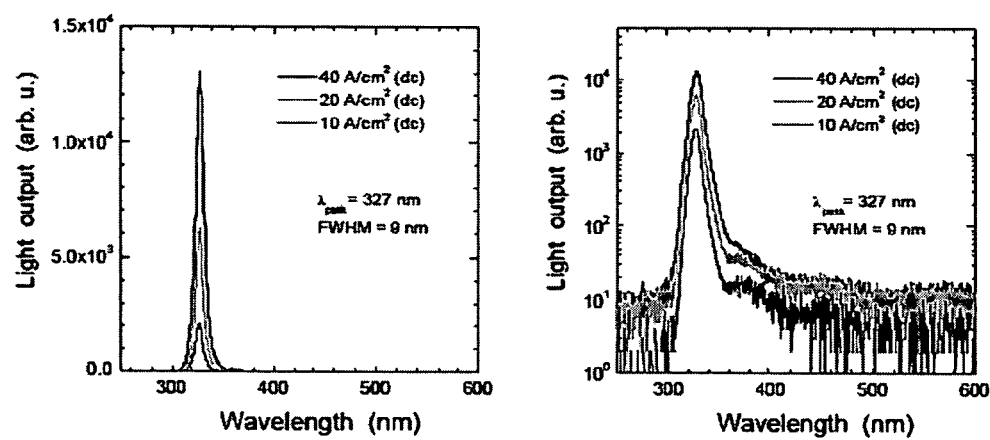
FIG. 6 is a graph of the Emission spectra (wavelength versus light output), for a deep UV light emitting diode grown on a GaN/sapphire template with a GaN/AlN superlattice strain relief structure according to the present invention.

With reference to FIG. 5 device voltage versus current performance is shown for a deep UV light emitting diode grown on a GaN/sapphire template with a GaN/AlN superlattice strain relief structure according to the present invention (performance measured after removal of the substrate, etching of the GaN and GaN/AlN superlattice and transfer onto a quartz wafer) with peak emission around 327 nm. Likewise, with reference to FIG. 6, shown therein is the emission spectra of the UV light emitting diode whose voltage-current data is shown in FIG. 5. The characterization data shows that after LLO and transfer of the device to a quartz substrate, the Deep UV LED still has good device performance, i.e. good IV performance, and narrow and clean emission spectra which indicate overall good material and device quality.

According to another embodiment for the production of a surface emitting LED shown in FIGS. 8A through 8F, a UV LED structure is transferred in fabrication from a sapphire substrate to UV transparent material/substrate via an intermediate host substrate. The intermediate host substrate may be quartz, a flex substrate that facilitates integration of the LED device into larger systems, etc.

Initially, an intermediate (possibly UV transparent) substrate 70 is bonded to a surface of the UV LED structure opposite the sapphire substrate using an adhesive/epoxy, as shown in FIG. 8A. A LLO procedure is performed (as described previously), removing the sapphire substrate from the GaN layer, as shown in FIGS. 8B and 8 C. Etching then removes GaN layer 14 (optionally a sacrificial planarizing layer 102 may be applied prior to etching), leaving the LED active region 52 (as well as additional layers) on the intermediate substrate, as shown in FIG. 8D. An n-contact layer 72 is then formed over the LED active region 52. Permanent substrate 74 is then bonded using a UV transparent epoxy (e.g., Epotek 301-2FL) to n-contact layer 72 (or alternatively, the substrate may form the n-contact, in which case substrate 74 is bonded directly to LED active region 52), as shown in FIG. 8E. In some instances a protective layer(s) may be applied to the lateral sides of the LED to insure the UV transparent epoxy does not bond with the intermediate substrate.

Two optional embodiments are now possible, each illustrated in FIG. 8F. In the first, the LED structure is released from the intermediate substrate 58 by emersion in a solvent (e.g., acetone) that dissolves the epoxy bonding the intermediate substrate 58 to the structure. Intermediate substrate 58 is then removed, leaving a device in which electrical contact is made from the top while light is extracted from the bottom of the device. In the second, intermediate substrate is UV transparent, and need not be removed. This also produces a device in which electrical contact is made from the top while the light is extracted from the bottom.

According to the present invention, a GaN/AlN strain relief layer formed over a GaN/sapphire template facilitates the formation of a substantially defect-free relatively high Al-content layer thereover. While particularly useful in optical systems, the present invention may also find applicability in non-optical systems. For example, copending U.S. patent application Ser. No. 10/952,202, which is incorporated by reference herein, discloses high electron mobility transistors (HEMTs) in which a relatively high Al-content AlGaN buffer layer is formed below an undoped GaN layer. The provision of a GaN/AlN strain relief layer in such a system may provide an improved quality AlGaN layer and hence improved quality GaN layer, ultimately providing improved device performance. Accordingly, another embodiment of the present invention provides a GaN/AlN strain relief layer for the growth of low defect, relatively high Al-content films over a GaN/sapphire template useful for non-optical applications.

In a preferred embodiment of the present invention, a GaN/AlN superlattice is formed over a GaN/sapphire template to serve in part as a strain relief layer for growth of deep UV light emitting diodes. Furthermore, it has been demonstrated that a GaN/AlN superlattice can be successfully used to mitigate the strain between a GaN/sapphire template and a high Al mole fraction deep UV light emitting diode heterostructure. Deep UV light emitting diodes have successfully been grown using this technique and working light emitting diodes have been demonstrated, including devices having a substrate removed by excimer laser lift-off. While this exemplary embodiment has been presented in the foregoing detailed description, it should be understood that a vast number of variations exist, and this preferred exemplary embodiment is merely a representative example, and is not intended to limit the scope, applicability or configuration of the invention in any way. Rather, the foregoing detailed description provides those of ordinary skill in the art with a convenient guide for implementation. of the invention, and it is contemplated that various changes in the functions and arrangements of the described embodiment may be made without departing from the spirit and scope of the invention defined by the claims thereto.

What is claimed is:

1. A semiconductor light emitting diode structure, comprising:
    a substrate;
    a template layer formed over and in contact with said substrate;
    a superlattice structure formed over and in contact with said template layer, said superlattice structure comprising:
        a plurality of layer pairs, a first layer of said layer pairs being AlN and a second layer of said layer pairs being GaN: and
    a light emitting multiple quantum well heterostructure of a composition including at least 25% aluminum, formed over said superlattice structure.

2. The semiconductor light emitting diode structure of claim 1, wherein said substrate is formed of $Al_2O_3$.

3. The semiconductor light emitting diode structure of claim 2, wherein said template layer is formed of GaN.

4. The semiconductor light emitting diode structure of claim 1, wherein said superlattice structure comprises at least 70 but no more than 90 layer pairs.

5. The semiconductor light emitting diode structure of claim 4, wherein each layer of each said layer pair is approximately 7 Å thick.

6. The semiconductor light emitting diode structure of claim 1, wherein said semiconductor light emitting diode structure is capable of emitting light at a wavelength of approximately 325 nm.

* * * * *